United States Patent
Lee et al.

(10) Patent No.: US 6,556,268 B1
(45) Date of Patent: Apr. 29, 2003

(54) METHOD FOR FORMING COMPACT LCD PACKAGES AND DEVICES FORMED IN WHICH FIRST BONDING PCB TO LCD PANEL AND SECOND BONDING DRIVER CHIP TO PCB

(75) Inventors: Yu-Chi Lee, Hsinchu (TW); Chin-Chen Yang, Hsinchu (TW); Hong-Yu Lin, Hsin-Chu (TW); Fang-I Shieh, Kaohsiung (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 09/282,689

(22) Filed: Mar. 31, 1999

(51) Int. Cl.$^7$ .............................................. G02F 1/1345
(52) U.S. Cl. ...................... 349/149; 349/151; 349/152
(58) Field of Search ................... 349/149, 151, 349/152, 153, 190; 438/30

(56) References Cited

U.S. PATENT DOCUMENTS

| | | | |
|---|---|---|---|
| 5,042,919 A | * 8/1991 | Yabu et al. | 359/88 |
| 5,710,612 A | * 1/1998 | Mase | 349/149 |
| 5,822,030 A | * 10/1998 | Uchiyama | 349/149 |
| 5,893,623 A | * 4/1999 | Muramatsu | 349/152 |
| 6,031,590 A | * 2/2000 | Kim | 349/86 |
| 6,061,246 A | * 5/2000 | Oh et al. | 361/749 |
| 6,091,475 A | * 7/2000 | Ogino et al. | 349/149 |
| 6,104,464 A | * 8/2000 | Adachi et al. | 349/150 |
| 6,111,628 A | * 8/2000 | Shiota et al. | 349/150 |
| 6,133,978 A | * 10/2000 | Tajima | 349/150 |
| 6,172,878 B1 | * 1/2001 | Takabayashi et al. | 361/760 |

* cited by examiner

Primary Examiner—Robert H. Kim
Assistant Examiner—Mike Qi
(74) Attorney, Agent, or Firm—Tung & Associates

(57) ABSTRACT

A method for forming a compact LCD package and devices formed by such method are disclosed. In the method, an LCD display panel is formed by bonding an upper glass panel and a lower glass panel together and exposing an edge portion formed by a larger lower glass panel. Conductive traces formed of a conductive film layer such as ITO is provided on the edge portion of the LCD display panel for providing electrical connection to the drive lines and scan lines for the LCD panel. A two-step bonding method is used to first bond a printed circuit board in a pre-bonding step to the exposed edge portion of the LCD panel by using an anisotropic conductive film layer. The bonding is conducted under pressure and heat such that electrical communication is established through the conductive metal particles contained in the anisotropic conductive film. In a second, or post-bonding step, an IC chip or a driver chip is bonded to the top of the PCB by a multiplicity of solder bumps formed on the driver chip connecting electrically to a second multiplicity of conductive pads formed on top of the PCB substrate. The present invention novel method therefore produces a more compact LCD package which saves a planar area in an edge portion by at least 50%. In the first pre-bonding method that utilizes an anisotropic conductive film, fabrication equipment for an outer lead bonding method can be utilized. In the post-bonding step, fabrication equipment for an inner lead bonding method can be used.

17 Claims, 2 Drawing Sheets

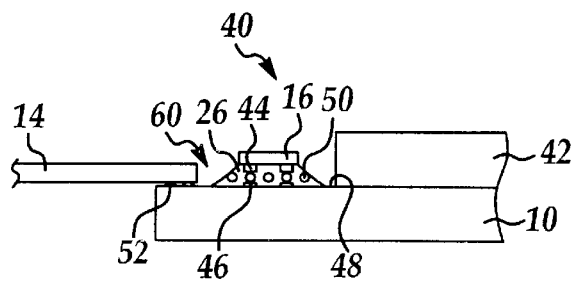
Figure 3A
Prior Art
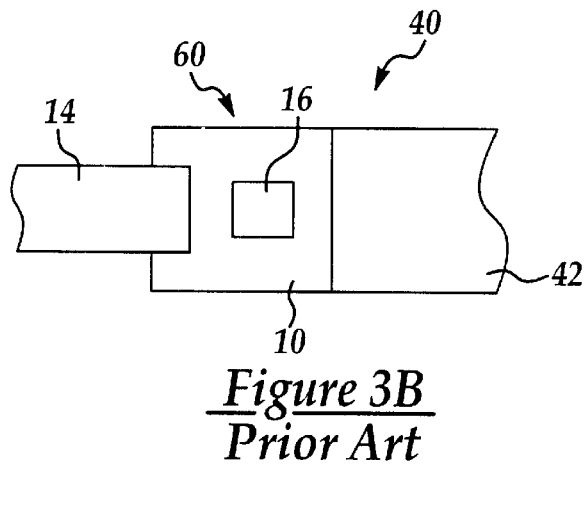
Figure 3B
Prior Art
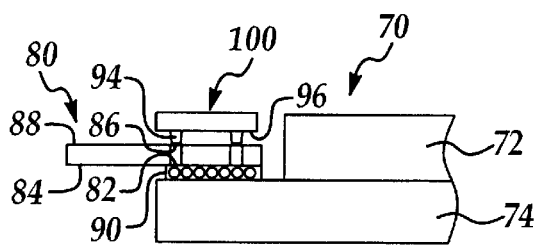
Figure 4A
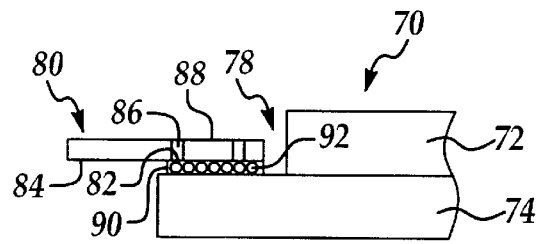
Figure 4B
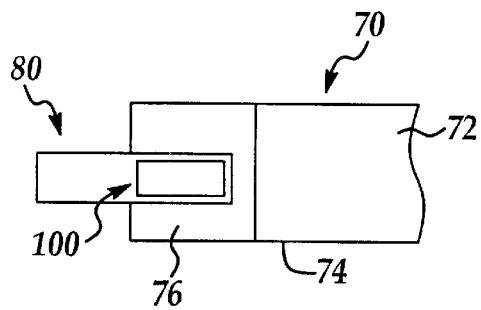
Figure 4D
Figure 4C

METHOD FOR FORMING COMPACT LCD PACKAGES AND DEVICES FORMED IN WHICH FIRST BONDING PCB TO LCD PANEL AND SECOND BONDING DRIVER CHIP TO PCB

FIELD OF THE INVENTION

The present invention generally relates to a method for forming an LCD package and device formed and more particularly, relates to a method for forming a compact LCD package that requires a substantially smaller planar area on the LCD for making connections to a driver chip and an external circuit and device formed.

BACKGROUND OF THE INVENTION

In recent years, liquid crystal display (LCD) panels have been used widely in place of cathode ray tubes (CRT) in electronic display applications. The LCD panel is first assembled together by filling a liquid crystal material in between a LCD substrate and a transparent glass cover plate. The LCD substrate consists of a multiplicity of switching, or electronic turn-on and turn-off devices for operating the multiplicity of pixels formed on the LCD panel.

After the assembly of a LCD panel is completed, the panel must be connected to an outside circuit for receiving electronic signals such that images may be produced in the panel. The electronic connections to the LCD panel can be provided by different techniques. A conventional technique for providing electronic signals to a LCD panel is by using a flexible printed circuit board (FPCB) which contains various electronic components welded thereto for providing signals to the LCD. The flexible printed circuit board is frequently manufactured of a conductive copper layer sandwiched between two flexible polyimide cover layers. The flexibility of FPCB is advantageous in the installation of a LCD panel. FIG. 1A is a graph illustrating a conventional design of LCD panel 10 connected by a FPCB 12 to a printed circuit board (PCB) 14 which has a surface mount technology (SMT) type IC chip 16 mounted on top.

In another conventional technique for bonding a LCD to a PCB, as shown in FIG. 1B, a tape automated bonding (TAB) technique is used. In the TAB bonding technique, a TAB section 20 is used to connect LCD 10 and PCB 14. The TAB section 20 consists of a TAB tape 22 which has an IC chip 16 connected to it through bonding sites 24. The TAB bonding technique provides the benefit of a compact package so that circuit density can be improved resulting in a lead pitch as low as 60 $\mu$m. The TAB, also known as TCP (tape carrier package) utilizes finely patterned thin metal, i.e., copper foil plated with Au or Sn, in place of wires and connects the metal tips metallurgically to corresponding gold plated bumps that are formed on the aluminum pads on the chip. TAB is preferred in smaller-pitch interconnects for high I/O ULSI devices because it enables smaller pitch and longer span bondings than those available by wire bonding. However, the TAB bonding technique is normally conducted at a higher fabrication cost.

In still another technique for bonding a LCD to a PCB, as shown in FIG. IC, a chip on glass (COG) technique is used. In the COG technique, an IC chip 16 is mounted directly on a LCD 10 by utilizing solder bumps 24 and an anisotropic conductive film (ACF) 26. Detailed cross-sectional views of an ACF 26 is shown in FIGS. 2A and 2B. As shown in FIG. 2A, a TAB tape 22 which has conductive pads 28 formed on top is positioned over an ACF tape 30 which contains electrically conductive particles 32 embedded an insulative compound 34. Positioned under the ACF 30 is a LCD substrate 10 which has conductive elements 36 formed on top. After the TAB tape 22, the ACF 30 and the LCD substrate 10 are pressed together under heat, as shown in FIG. 2B, the conductive particles 32 provides electrical communication between the conductive pads 28 and the conductive elements 36 and therefore allowing the TAB tape 22 to electrically communicate with the LCD substrate 10. It should be noted that, electrical communication between the conductive pads 28 and the conductive elements 26 is only established where the conductive particles 32 are compressed, i.e., only established anisotropically and selectively. The conductive elements 36 on the LCD substrate 10 is normally formed of indium-tin-oxide (ITO) thin films.

As shown in FIG. 1C, the COG technique may further connect the LCD substrate 10 to a printed circuit board (not shown) by a flexible printed circuit board (not shown). The COG technique therefore relies on bonding with solder bumps 24 formed on an IC chip and the ACF for electrical communications.

Each of the three conventional techniques for forming a TFT-LCD assembly has its benefits and disadvantages. For instance, in the first technique of using SMT/FPCB, the circuit density can be increased to achieve a compact package at the expense of using difficult TAB technology and high material costs. In the TAB and COG method, a rework of the assembly such as the removal of a defective IC from a LCD substrate is extremely difficult, if not impossible. For instance, the only possible means for removing an IC chip that is bonded to a LCD substrate is by using a shear force for pushing an IC chip and breaking its bond with the LCD substrate. This is a difficult process and frequently results in the destruction of the entire assembly.

In the present fabrication process for TFT-LCD assemblies, the SMT/FPCB method is frequently used in fabricating lower priced assemblies such as those utilizing small LCD panels. In large LCD panel applications, i.e., such as those used in notebook computers, the TAB bonding method is normally used. The COG method, due to its difficulty in reworking and repair, is also limited to small LCD panel display applications. The TAB process and the COG process are therefore the two major assembling methods used for TFT-LCD assemblies. To sum up, the TAB method can be easily reworked and repaired by removing an IC chip from the TAB tape and furthermore, it is compact in size which allows the achievement of high density packages of up to 60 $\mu$m pitch. However, the TAB process requires complicated fabrication steps which include IC bonding, tape fabrication, inner lead bonding, encapsulation, outer lead bonding and the ACF process. Another drawback for the TAB process is, during the ACF processing, there is a thermal expansion problem which may lead to misalignment between the leads. The TAB tape may further absorb moisture and contribute to its dimensional instability. Elaborate equipment may also be required for the TAB process and therefore increasing its fabrication costs.

In the COG process, while the fabrication steps required are simpler, i.e., only IC bumping and ACF processes are required, and furthermore, there is no thermal expansion problem and smaller pitch such as 50 $\mu$m can be achieved, the fabrication of an LCD package of compact size is nevertheless difficult. This difficulty is illustrated in FIGS. 3A and 3B. In FIG. 3A, a cross-sectional view of an LCD package 40 which consists of an LCD substrate shown as a lower glass panel 10, an upper glass panel 42, an IC chip (or a driver chip) 16, an anisotropic conductive film (ACF) layer 26, and a printed circuit board (or a flexible printed circuit board) 14 is shown. The driver chip 16 is equipped with a multiplicity of solder bumps 44 formed on an active surface of the chip 16 for making electrical connection with a second multiplicity of conductive leads 46 (such as ITO leads) formed on the top surface 48 of the lower glass panel 10. The electrical communication is established by using the anisotropic conductive film layer 26 which is loaded with electrically conductive particles 50. In order to communicate with the outside circuits, such as circuits on the PCB 14, electrical communication through a third multiplicity of conductive pads 52 is provided between the PCB 14 and the lower glass panel 10. A plane view of the LCD package 40 is further shown in FIG. 3B.

As shown in FIGS. 3A and 3B, the lower glass panel 10 of the LCD package 40 is normally provided with a larger area than the upper glass panel 42 and thus leaving an exposed edge area 60 necessary for mounting of the driver chip 16 and the PCB 14. The excess edge portion 60 therefore cannot be reduced which results in excessively large LCD packages that are not suitable for certain applications that require a compact LCD package. The technology of connecting driver chips and external PCB circuits to an LCD package therefore must be improved in order to produce compact LCD panels.

It is therefore an object of the present invention to provide a method for forming a compact LCD package that does not have the drawbacks or shortcomings of the conventional methods.

It is another object of the present invention to provide a method for forming a compact LCD package by stacking a driver chip on top of a printed circuit board prior to assembling the board to the LCD panel.

It is a further object of the present invention to provide a method for forming a compact LCD package that does not require separate planar areas for mounting a driver chip and a PCB.

It is another further object of the present invention to provide a method for forming a compact LCD package by first bonding a PCB to a lower glass panel of an LCD device.

It is still another object of the present invention to provide a method for forming a compact LCD package by first bonding a flexible PCB to the lower glass panel of a LCD by using an anisotropic conductive film layer.

It is yet another object of the present invention to provide a method for forming a compact LCD package by first bonding a PCB to the lower glass panel of a LCD and then bonding a driver chip on top of the PCB by solder bumps.

It is still another further object of the present invention to provide a compact LCD package that includes an LCD panel which has an exposed edge portion formed by a lower glass panel, a printed circuit board bonded on top of the exposed edge portion of the LCD panel, and a driver chip bonded to the top of the PCB.

It is yet another further object of the present invention to provide a compact LCD package that consists of an LCD panel that has an exposed edge portion formed by a lower glass panel, a flexible printed circuit board bonded to the exposed edge portion by an anisotropic conductive film layer, and a driver chip bonded to the top of the PCB by solder bumps.

SUMMARY OF THE INVENTION

In accordance with the present invention, a method for forming a compact LCD package and a device formed by the method are disclosed.

In a preferred embodiment, a method for forming a compact LCD package can be carried out by the operating steps of first providing an LCD panel by bonding an upper glass panel and a lower glass panel together with a liquid crystal material sandwiched thereinbetween, the lower glass panel is larger in area than the upper glass panel providing an exposed edge portion which is equipped with a first multiplicity of conductive elements thereon, then providing at least one driver chip equipped with solder bumps on an active surface for electrically connecting to the first multiplicity of conductive elements on the lower glass panel, providing a printed circuit board which has a second multiplicity of conductive leads on a top surface in electrical communication with a third multiplicity of conductive leads on a bottom surface, providing an insulating film of thermally fusible material that is loaded with electrically conductive particles therein, positioning sequentially the insulating film of thermally fusible material on top of the exposed portion of the lower glass panel over the first multiplicity of conductive elements, and the PCB on top of the insulating film with the third multiplicity of conductive leads contacting the film forming a first stack, compressing the first stack under a pressure and temperature sufficient to establish electrical communication between the third multiplicity of conductive leads on the PCB and the first multiplicity of conductive elements on the exposed edge portion of the LCD panel through the electrically conductive particles in the insulating film, positioning the at least one driver chip on top of the PCB with the solder bumps contacting the second multiplicity of conductive leads forming a second stack, and compressing the second stack under a pressure and temperature sufficient to establish electrical communication between the solder bumps on the at least one driver chip and the second multiplicity of conductive leads on the PCB.

In the method for forming a compact LCD package, the first stack formed by the PCB positioned on the exposed edge portion of the LCD display panel occupies a substantially reduced planar area. The first multiplicity of conductive elements is adapted for connecting to drive lines and scan lines of the LCD display panel. The at least one driver chip may be at least one flip chip. The method may further include the step of providing a flexible PCB which has a second and a third multiplicity of conductive leads thereon. The method may further include the step of providing the insulating film in an anisotropic conductive film. The method may further include the step of providing the insulating film in a polymeric based film filled with electrically conductive particles.

In the method for forming a compact LCD package, the method may further include the step of forming the first multiplicity of conductive leads with indium-tin-oxide (ITO) traces on a glass surface. The method may further include the step of forming the second multiplicity and the third multiplicity of conductive leads with an electrically conductive metal selected from the group consisting of copper and aluminum, or with copper coated with gold. The method may further include the step of forming solder bumps on the at least one driver chip in gold. The substantially reduced planar area may be about 50% of the original area required for connecting the PCB.

The present invention is further directed to a compact LCD package that includes an LCD panel formed of an upper glass panel and a lower glass panel, the lower glass panel is larger in area than the upper glass panel for producing an exposed edge portion equipped with a first multiplicity of conductive leads, a printed circuit board which has a third multiplicity of conductive leads on a bottom surface bonded to the first multiplicity of conductive leads on the exposed edge portion, and at least one drive chip equipped with a fourth multiplicity of solder bumps on at least one active surface bonded to a second multiplicity of conductive leads on a top surface of the PCB.

The compact LCD package may further include an insulating film filled with electrically conductive particles sandwiched between the PCB and the exposed edge portion of the LCD lower glass panel, the conductive particles provide electrical communication between the third multiplicity of conductive leads on the PCB and the first multiplicity of conductive leads on the. LCD panel. The first multiplicity of conductive leads on the LCD lower glass panel are drive lines and scan lines for the LCD. The package may further include an anisotropic conductive film layer sandwiched between the PCB and the LCD panel. The at least one driver chip may be at least one flip chip.

In an alternate embodiment, the present invention discloses a two-step method for bonding a driver chip to an LCD panel which includes the steps of pre-bonding a printed circuit board to an edge portion of an LCD panel by electrically connecting a second multiplicity of conductive leads on a bottom surface of the PCB to a first multiplicity of conductive leads on the edge portion of the LCD panel, and post-bonding a driver chip to the PCB by electrically connecting solder bumps formed on a bottom surface of the drive chip to a third multiplicity of conductive leads formed on a top surface of the PCB.

The two-step method for bonding a driver chip to an LCD panel may further include the step of pre-bonding the PCB to the LCD panel by using an anisotropic conductive film sandwiched thereinbetween. The pre-bonding step may be conducted by an outer lead bonding technique and the post-bonding step may be conducted by an inner lead bonding technique. The method may further include the step of providing a flexible printed circuit board for the PCB. The method may further include the step of providing the first multiplicity of conductive leads on the edge portion of the LCD panel for connecting to drive lines and scan lines of the LCD panel.

BRIEF DESCRIPTION OF THE DRAWINGS

These and other objects, features and advantages of the present invention will become apparent from the following detailed description and the appended drawings in which:

FIG. 3A is a cross-sectional view of a conventional bonding arrangement for a PCB and a driver chip bonded to an LCD panel.

FIG. 3B is a plane view of the LCD package bonded in FIG. 3A.

FIG. 4A is a cross-sectional view illustrating a present invention liquid crystal display panel.

FIG. 4B is the present invention liquid crystal display panel of FIG. 4A with a PCB bonded on top by an anisotropic conductive film.

FIG. 4C is a cross-sectional view of the present invention LCD package formed by stacking an IC driver chip on top of the PCB and the LCD panel.

FIG. 4D is a plane view of the bonded LCD package shown in FIG. 4C.

DETAILED DESCRIPTION OF THE PREFERRED EMBODIMENT

Figure 1A:
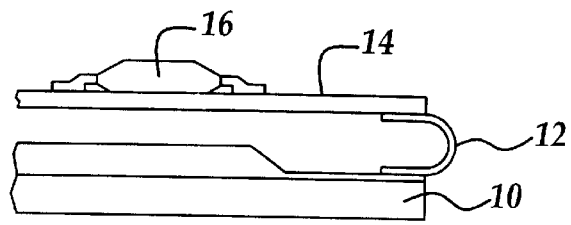
FIG. 1A is a graph illustrating a conventional SMT type IC bonded to a PCB and connected to an LCD substrate by a flexible printed circuit board.
Figure 1B:
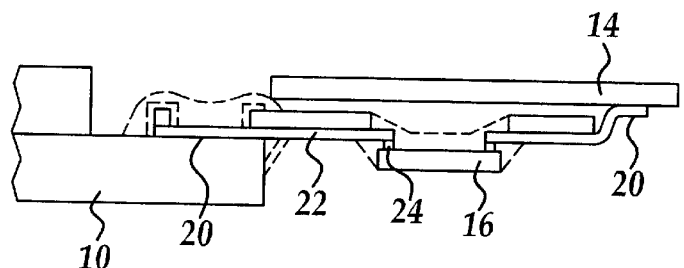
FIG. 1B is a graph illustrating a conventional method of using a TAB tape for connecting an LCD substrate to a PCB.
Figure 1C:
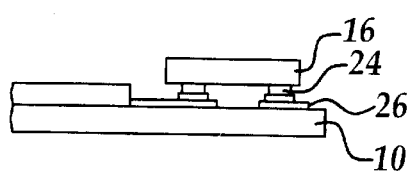
FIG. 1C is a graph illustrating a conventional COG technique for connecting an IC chip to an LCD substrate.

The present invention discloses a method for forming a compact LCD package of an IC driver chip, a flexible PCB and a LCD display panel. In the method, a two-step bonding technique is utilized which includes a pre-bonding step and a post-bonding step. In the pre-bonding step, an outer lead bonding technique and equipment may be used to bond a PCB, or a flexible PCB to an LCD lower glass plate by utilizing a layer of an anisotropic conducive film thereinbetween. After the pre-bonding process, a multiplicity of conductive traces on the lower glass plate formed by an ITO layer are bonded to a multiplicity of conductive pads formed on the PCB. In the second or post-bonding process, an IC chip or a driver chip is bonded to the PCB film by an inner lead bonding technique and equipment. During this second step bonding, a multiplicity of solder bumps formed on an active surface of the driver chip are electrically connected to a multiplicity of conductive pads formed on a top surface of the PCB. The present invention therefore provides an advantageous process capable of providing a compact-sized liquid crystal display package.

In the pre-bonding process, a first stack of PCB/ACF/LCD is formed. In the second post-bonding process, a second stack of driver chip/PCB is formed. By utilizing the present invention novel method, a substantial planar area on an LCD display panel edge portion can be saved. For instance, a planar area of approximately 50% of the exposed edge portion on a lower glass panel. As a result, an LCD package of substantially reduced planar area may be fabricated that is suitable for applications where a compact-sized LCD must be used.

The present invention compact LCD package positions input traces for the driver chip on a separate substrate such that the requirement of building input traces on the LCD glass panel is eliminated resulting in a reduction in the glass space needed by a conventional COG technique. The present invention novel method may be illustrated in FIGS. 4A~4D. FIG. 4A is a cross-sectional view of a present invention LCD display panel 70. The LCD display panel 70 is constructed by an upper glass panel 72 and a lower glass panel 74 with a layer of liquid crystal material (not shown) sandwiched thereinbetween. The lower glass panel 74 has a top surface 76 exposed in an edge portion 78 which is not covered by the upper glass panel 72. On the top surface 76 of the edge portion 78, a multiplicity of conductive traces (not shown) are formed for providing connections to the LCD panel 70 for the drive lines and the scan lines. The conductive traces are normally formed by a layer of ITO conductive film and patterned for any specific circuits. Any other suitable conductive material layer, other than ITO, may also be used to form the conductive traces or the input traces.

In the next step of the process, a pre-bonding is conducted which bonds a PCB 80 to the exposed edge portion 78 of the LCD panel 70. The PCB may be formed of any type of circuit boards including those of flexible printed circuit boards. The PCB 80 may be provided with a third multiplicity of conductive leads 82 on a bottom surface 84 and a second multiplicity of conductive leads 86 on a top surface 88. While the bottom conductive leads 82 and the top conductive leads 86 appear to be directly connected by an interconnect in FIG. 4B, it should be noted that FIG. 4B is presented in a simplified manner in that the bottom leads and the top leads may not be directly connected. For instance, the top conductive leads and the bottom conductive leads may be connected through other interconnect layers (not shown) formed in the PCB 80.

Figure 2A:
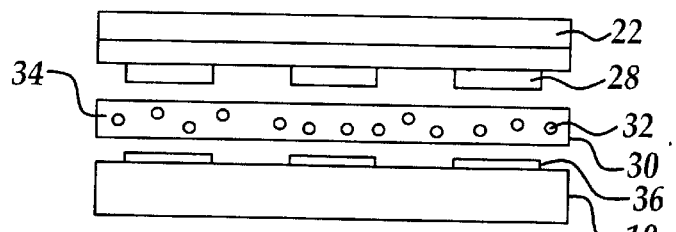
FIG. 2A is a graph illustrating a method for bonding a TAB tape to an LCD substrate by an anisotropic conductive film.
Figure 2B:
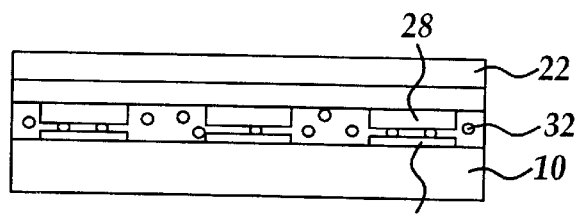
FIG. 2B is a graph illustrating the components of FIG. 2A after compressed together under heat and electrical communication between the TAB tape and the LCD substrate is established.

The connection of the PCB 80 to the lower glass panel 74 may be accomplished by using an anisotropic conductive film (ACF) layer 90. The ACF layer 90 may be similar to those shown in detail in FIGS. 2A and 2B as layer 30. The ACF layer 90 is filled with electrically conductive particles 92 embedded therein. Electrical communication between the first multiplicity of conductive leads 82 and the surface traces (not shown) on the lower glass panel 74 is achieved by the conductive particles 92 when the PCB 80 is pressed against the LCD panel 70 under heat. The first multiplicity of conductive leads 82 formed on the bottom surface 84 of the PCB 80 may be suitably formed of copper or copper plated with gold for improved electrical conductivity. The bonding technique utilized in bonding the PCB 80 to the LCD panel 70 by the ACF layer 90 can be conducted in a typical fabrication equipment used for outer lead bonding.

It should be noted that the present invention method is not only suitable for bonding a PCB to an LCD assembly, but also suitably for bonding a PCB to another PCB or any other circuit boards.

In the next bonding step, i.e., a post-bonding step as shown in FIG. 4C, an IC chip, or a driver chip 100 is bonded to the top surface 88 of the PCB 80 by using a multiplicity of solder bumps 94 formed on an active surface 96 of the driver chip 100. The multiplicity of solder bumps 94 may be suitably formed of gold which can be bonded at a temperature of approximately 500° C. to the second multiplicity of conductive pads 86 formed on the top surface 88 of the PCB 80. The post-bonding process, or the second bonding step in a two-step bonding method, therefore completes the present invention novel fabrication method. A plane view of the completed LCD assembly 40 is shown in FIG. 4D. It should be noted that by utilizing the present invention novel method, a greatly improved compact-sized LCD package can be formed. By assembling the driver chip 100 on top of the PCB 80 and then bonding both to the exposed edge portion 78 of the LCD package 70 provides a significant planar area saving. For instance, in most LCD applications, approximately 50% of the planar surface area can be saved by utilizing the present invention novel bonding technique.

The present invention novel method and devices formed by such method have therefore been amply described in the above descriptions and in the appended drawings of FIGS. 4A–4D.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming a compact LCD package comprising the steps of:
   providing an LCD display panel by bonding an upper glass panel and a lower glass panel together with a liquid crystal material sandwiched therein between, said lower glass panel being larger in area than said upper glass panel producing an exposed edge portion equipped with a first multiplicity of conductive elements thereon,
   providing at least one driver chip equipped with solder bumps on an active surface for electrically connecting to said first multiplicity of conductive elements on said lower glass,
   providing a printed circuit board (PCB) having a second multiplicity of conductive leads on a top surface in electrical communication with a third multiplicity of conductive leads on a bottom surface,
   providing an insulating film of thermally fusible material loaded with electrically conductive particles therein,
   positioning sequentially said insulating film of thermally fusible material on top of said exposed portion of said lower glass over said first multiplicity of conductive elements and said PCB on top of said insulating film with said third multiplicity of conductive leads contacting said film forming a first stack,
   compressing said first stack under a pressure and temperature sufficient to establish electrical communication between said third multiplicity of conductive leads on said PCB and said first multiplicity of conductive elements on said exposed edge portion of said LCD display panel through said electrically conductive particles in said insulating film,
   positioning said at least one driver chip on top of said PCB, said at least one driver chip overlapping said exposed portion of said lower glass with said solder bumps contacting said second multiplicity of conductive leads forming a second stack, and
   compressing said second stack under a pressure and temperature sufficient to establish electrical communication between said solder bumps on said at least one driver chip and said second multiplicity of conductive leads on said PCB.

2. A method for forming a compact LCD package according to claim 1, wherein said first stack formed by said PCB positioned on said exposed edge portion of the LCD display panel occupies a substantially reduced planar area.

3. A method for forming a compact LCD package according to claim 1, wherein said first multiplicity of conductive elements being adapted for connecting to drive lines and scan lines of said LCD display panel.

4. A method for forming a compact LCD package according to claim 1, wherein said at least one driver chip being at least one flip chip.

5. A method for forming a compact LCD package according to claim 1 further comprising the step of providing a flexible PCB having a second and a third multiplicity of conductive leads therein.

6. A method for forming a compact LCD package according to claim 1 further comprising the step of providing said insulating film in an anisotropic conductive film.

7. A method for forming a compact LCD package according to claim 1 further comprising the step of providing said insulating film in a polymeric based film filled with electrically conductive particles.

8. A method for forming a compact LCD package according to claim 1 further comprising the step of forming said first multiplicity of conductive leads with indium-tin-oxide (ITO) traces on a glass surface.

9. A method for forming a compact LCD package according to claim 1 further comprising the step of forming said second multiplicity and said third multiplicity of conductive leads with an electrically conductive metal selected from the group consisting of copper and aluminum.

10. A method for forming a compact LCD package according to claim 1 further comprising the step of forming said second multiplicity and said third multiplicity of conductive leads with copper coated with gold.

11. A method for forming a compact LCD package according to claim 1 further comprising the step of forming solder bumps on said at least one driver chip in gold.

12. A method for forming a compact LCD package according to claim 2, wherein said substantially reduced planar area is about 50% of the original area required for connecting said PCB.

13. A two-step method of bonding a driver chip to an LCD panel comprising the steps of:

pre-bonding a printed circuit board (PCB) to an edge portion of an LCD panel by electrically connecting a second multiplicity of conductive leads on a bottom surface of said PCB to a first multiplicity of conductive leads on said edge portion of said LCD panel, and positioning a driver chip on said PCB such that said driver chip overlaps said edge portion of the LCD panel by electrically connecting solder bumps formed on an active surface of said driver chip to a third multiplicity of conductive leads formed on a top surface of said PCB.

14. A two-step method of bonding a driver chip to an LCD panel according to claim 13 further comprising the step of pre-bonding said PCB to said LCD panel by using an anisotropic conductive film (ACF) sandwiched thereinbetween.

15. A two-step method of bonding a driver chip to an LCD panel according to claim 13, wherein said pre-bonding step being conducted by an outer lead bonding technique and said post-bonding step being conducted by an inner lead bonding technique.

16. A two-step method of bonding a driver chip to an LCD panel according to claim 13 further comprising the step of providing a flexible printed circuit board for said PCB.

17. A two-step method of bonding a driver chip to an LCD panel according to claim 13 further comprising the step of providing said first multiplicity of conductive leads on said edge portion of said LCD panel for connecting to drive lines and scan lines of said LCD panel.

* * * * *